US006916733B2

(12) United States Patent
Lee

(10) Patent No.: US 6,916,733 B2
(45) Date of Patent: Jul. 12, 2005

(54) METHOD FOR FABRICATING CONTACT PAD OF SEMICONDUCTOR DEVICE

(75) Inventor: Sung-Kwon Lee, Kyoungki-do (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 110 days.

(21) Appl. No.: 10/660,299

(22) Filed: Sep. 11, 2003

(65) Prior Publication Data

US 2004/0127024 A1 Jul. 1, 2004

(30) Foreign Application Priority Data

Dec. 27, 2002 (KR) .................................. 10-2002-0085124

(51) Int. Cl.[7] ......................................... H01L 21/4763
(52) U.S. Cl. ..................................... 438/618; 438/641
(58) Field of Search ............................ 438/618, 622, 438/638, 641, 672–673, 666, 675, 704, 740, 745

(56) References Cited

U.S. PATENT DOCUMENTS

| 5,854,127 | A | | 12/1998 | Pan |
| 6,037,211 | A | | 3/2000 | Jeng et al. |
| 6,232,656 | B1 | * | 5/2001 | Yabu et al. .................. 257/690 |
| 6,261,968 | B1 | * | 7/2001 | Lee ............................. 438/734 |
| 6,329,251 | B1 | * | 12/2001 | Wu .............................. 438/275 |
| 6,358,863 | B1 | | 3/2002 | Desu et al. |

* cited by examiner

Primary Examiner—David Nelms
Assistant Examiner—David Vu
(74) Attorney, Agent, or Firm—Marshall, Gerstein & Borun LLP

(57) ABSTRACT

The method forming a contact pad of a semiconductor device, including forming a plurality of conductive layer patterns displaced on a silicon substrate with adjoining to each other; forming an insulating layer on a top of the conductive layer patterns; depositing a material layer serving as a hard mask on the insulating layer; forming a photoresist pattern between the conductive layer patterns on the hard mask material layer to form a contact hole; defining an area for forming a contact by forming by etching the hard mask material layer with utilizing the photoresist pattern as an etching mask; removing the photoresist pattern; exposing the silicon substrate by etching the insulating layer with utilizing the hard mask as an etching mask to thereby form an open portion; forming a polymer layer on the open portion; exposing the silicon substrate by removing the hard mask and the polymer layer by implementing an etch back process; and forming a contacted pad on the exposed silicon substrate.

16 Claims, 8 Drawing Sheets

40 of the contact pad by using the SEG method and a contact pad formed by using a poly silicon deposition.

METHOD FOR FABRICATING CONTACT PAD OF SEMICONDUCTOR DEVICE

BACKGROUND

1. Technical Field

A semiconductor memory device and, more specifically, a method for fabricating a pad by using a self align contact (SAC) are disclosed.

2. Description of the Related Art

In a semiconductor device, a self align contact(SAC) pad plays a role of electrically connecting a conductive area of a substrate such a source/drain junction with a bottom electrode or a bit line.

As modem semiconductor devices require a very thin line width being thinner than 100 nm, a photolithography process employing fluoride argon(ArF) furnace light source has been introduced.

FIG. 1 is a scanning electron microscopy(SEM) photography illustrating the pattern of the semiconductor device formed by an ArF photolithography process.

Referring to FIG. 1, a plurality of isolated patterns is disposed at a predetermined interval. In an ArF type photoresist, for example, cycloolefin-maleic anhydride (COMA) or acrylates have very poor etch resistance to fluoride gas during the SAC etching, thereby causing the distortion of patterns represented by a reference numeral '10' in the photograph.

In order to prevent such distortions of the patterns 10, a hard mask such as a poly silicon layer or a silicon nitride layer is utilized on the insulator layer such as an oxide layer when the contact hole pattern is formed. In this case, the photo resist pattern is used as an etching mask for patterning only the hard mask.

FIG. 2 is a scanning electron microscopy(SEM) photograph illustrating a top and a cross sectional view of the semiconductor device formed a contact pad thereon.

Referring to FIG. 2, a plurality of gate electrode patterns 20 in the form of a line is displaced and a plurality of contact pads 21 is formed between the gate electrode patterns 20.

Meanwhile, in a conventional method for implementing a SAC etching process by using a hard mask, in case when the hard mask is not removed before the deposition of a conductive material for forming the contact hole, an under cut occurs, when a poly silicon is utilized as a contact pad conductive material. The indirect will occur after the SAC etching an opening portion is expanded by a wet etching due to the hard mask or a cleaning process is performed before the deposition of the contact pad conductive material. Also, a void or a seam 22 occurs during the deposition of the conductive material such as a polysilicon. Also, a lifting of the hard mask occurs during the cleaning process.

On the other hand, after the forming of the SAC is performed, a selective epitaxial growth (SEG) method has been actively developed as a method for forming the contact pad. If the contact pad is formed by the SEG method, it has the benefit of reducing the contact resistance by 1~2 times in a technology having a line width below 0.1 $\mu$m in comparison with forming the contact pad by using a conventional poly silicon deposition.

FIGS. 3A and 3B are graphs representing a cell resistance between a contact pad formed by using the SEG method and a contact pad formed by using a poly silicon deposition.

FIG. 3A graphically illustrates the cell resistance (k$\Omega$/Tr) versus the size of probability to be accumulated. Referring to FIG. 3A, the pad (A) formed by using the SEG method primarily exists below the cell resistance of 20 (k$\Omega$/Tr). In contrast, the pad (B) formed by using a conventional poly silicon deposition method does not exist below the cell resistance of 20 (k$\Omega$/Tr) but primarily exits the region between the cell resistance of 20 (k$\Omega$/Tr) and the cell resistance of 20 (k$\Omega$/Tr).

And also, FIG. 3B graphically illustrates the changes of the cell resistance (k$\Omega$/Tr) versus the area of contact opening ($\mu$m$^2$). Referring to FIG. 3B, if pad (A) is formed by using the SEG method and pad (B) is formed by using a conventional poly silicon deposition method, they have the same contact opening area and the cell resistance (k$\Omega$/Tr) of pad (A) formed by using the SEG method appears at the bottom of the drawing in comparison with the cell resistance (k$\Omega$/Tr) of the pad (B) formed by using a conventional poly silicon deposition method, thereby resulting the cell resistance of pad (A) being smaller than the cell resistance pad (B).

FIG. 4 is a SEM photograph depicting an abnormal silicon growth during a pad is formed by using the SEG method.

Referring to FIG. 4, since the thin film formed by using the SEG method causes an irregular silicon growth during the growing process, a device defect occurs such as a silicon cluster. The reference numeral '40' represents a lump of silicon created by breaking the selectivity during the SEG growth. Such silicon lump 40 is a source of defect during subsequent processes, thereby causing the failure of device.

In addition, a silicon epitaxial layer grown by the SEG method has a problem of overgrowth of the SEG in the top portion of the hard mask when the hard mask is a polysilicon disposed on the insulating layer such as an oxide layer. The epitaxial layer has a tendency to grow in an angled shape such as a facet and causes a void in the insulating layer during the subsequent forming of the insulating layer.

Therefore, when the contact pad is formed by using the SEG method, a process is needed for protecting against an irregular silicon growth in the contact pad.

SUMMARY OF THE DISCLOSURE

A method for forming an effective thin pattern and for fabricating a contact pad of a semiconductor device is disclosed that is capable of suppressing an abnormal overgrowth of the top portion of a hard mask when a silicon layer is formed on a contacted pad by using a selective epitaxial growth(SEG) method.

A disclosed method for fabricating a contact pad of a semiconductor device comprises: forming a plurality of conductive layer patterns displaced on a silicon substrate with adjoining to each other; forming an insulating layer on a top of the conductive layer patterns; depositing a material layer serving as a hard mask on the insulating layer; forming a photoresist pattern between the conductive layer patterns on the hard mask material layer to form a contact hole; defining an area for forming a contact by forming by etching the hard mask material layer with utilizing the photoresist pattern as an etching mask; removing the photoresist pattern, exposing the silicon substrate by etching the insulating layer with utilizing the hard mask as an etching mask to thereby form an open portion; forming a polymer layer on the open portion; exposing the silicon substrate by removing the hard mask and the polymer layer by implementing an etch back process; and forming a contacted pad on the exposed silicon substrate.

BRIEF DESCRIPTION OF THE DRAWINGS

The above and other features of the disclosed processes will become apparent from the following description of preferred embodiments taken in conjunction with the accompanying drawings, wherein.

DETAILED DESCRIPTION OF THE PRESENTLY PREFERRED EMBODIMENTS

FIGS. 5A to FIG. 5G are cross-sectional views for illustrating a disclosed method for fabricating a contact pad of a semiconductor device.

Figure 1:
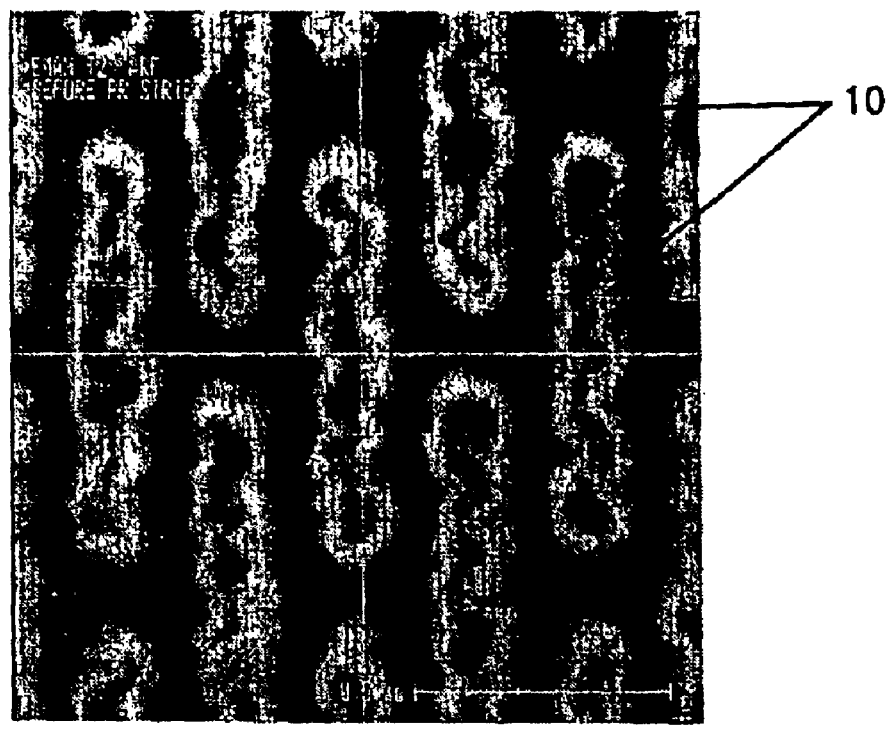
FIG. 1 is a scanning electron microscopy(SEM) photograph illustrating the pattern of the semiconductor device formed by an ArF photolithography process.
Figure 2:
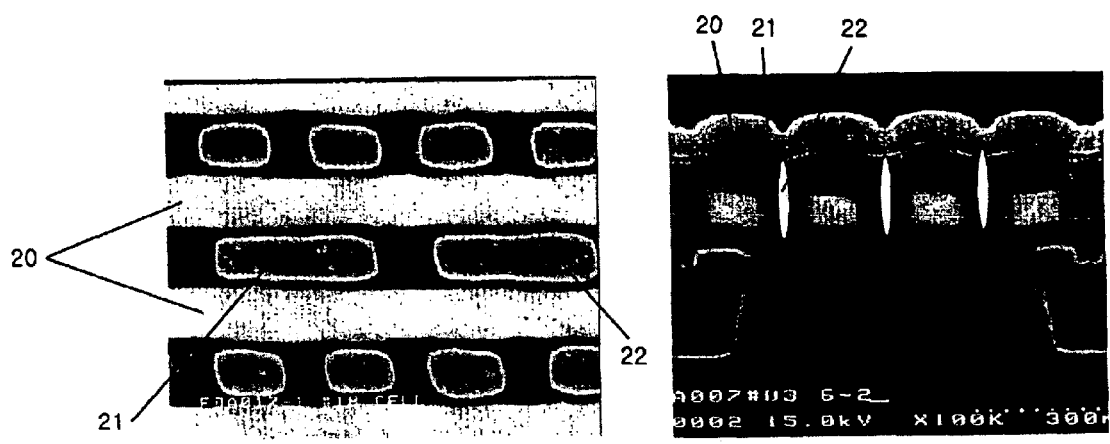
FIG. 2 is a scanning electron microscopy(SEM) photograph illustrating a top and a cross sectional view of the semiconductor device formed a contact pad thereon.
Figure 3A:
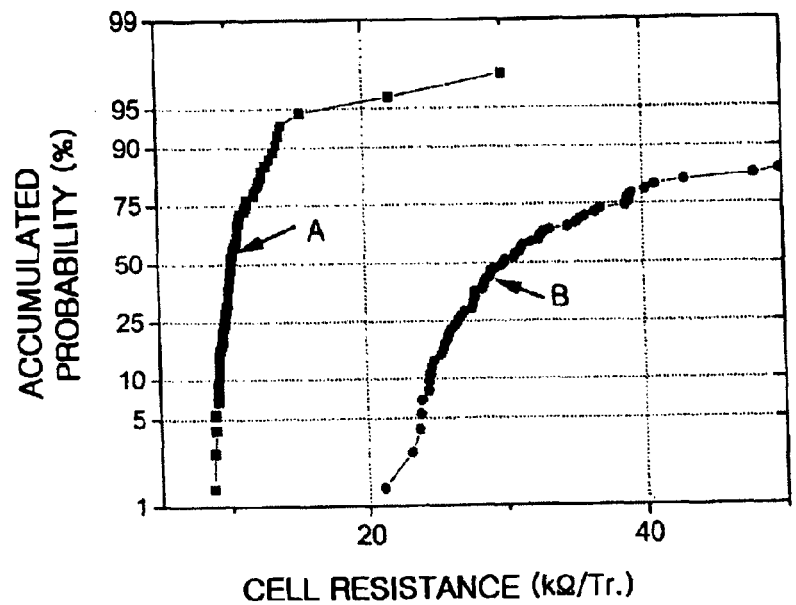
FIGS. 3A and 3B graphically represent cell resistance between a contact pad formed by using the SEG method and a contact pad formed by using a poly silicon deposition.
Figure 3B:
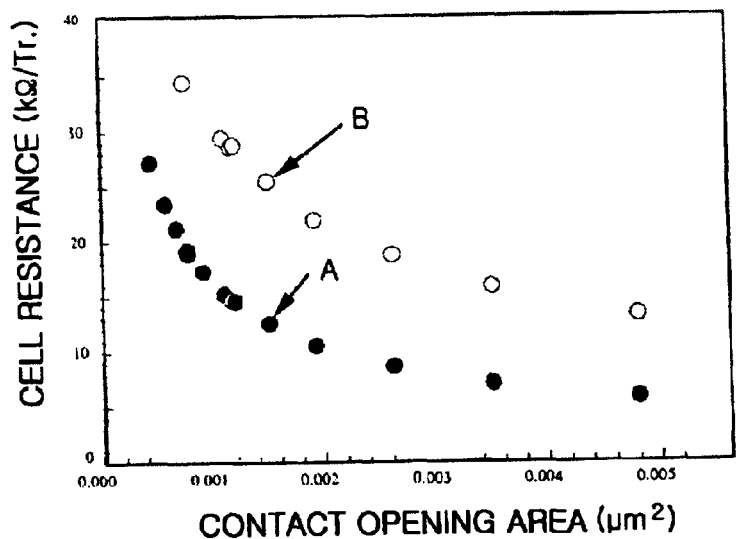
Figure 4:
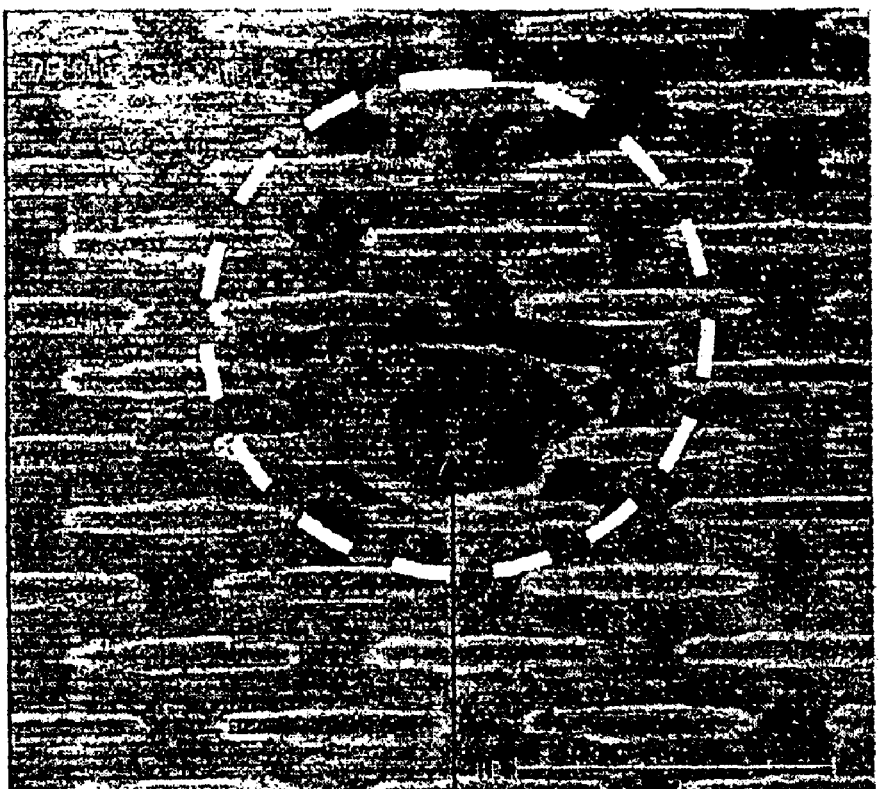
FIG. 4 is a SEM photograph depicting an abnormal silicon growth during a pad is formed by using the SEG method.
Figure 5A:
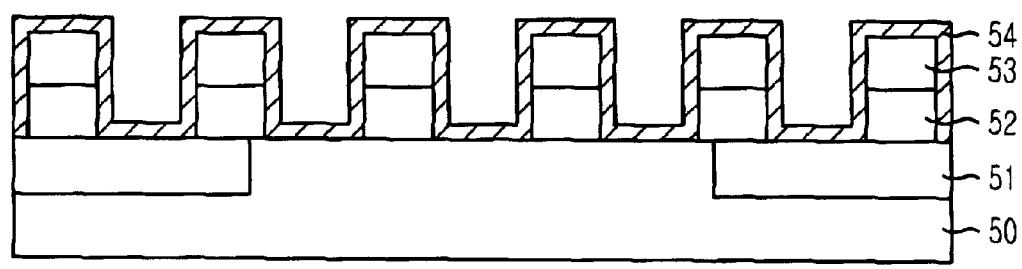
FIGS. 5A to FIG. 5G are cross-sectional views for illustrating a disclosed method for fabricating a contact pad of a semiconductor device in accordance with a preferred embodiment.

As shown in FIG. 5A, a conductive pattern having a predetermined configuration is formed on a silicon substrate 50 provided with various elements such as a field oxidation layer 51 and an impurity junction layer(not shown) to form a semiconductor device.

Here, the conductive pattern includes a bit line, a metal wiring or a gate electrode pattern.

In accordance with a preferred embodiment, the following description is described hereinafter in detail for the manufacturing process, for example, in case when the conductive pattern described above is a gate pattern.

After depositing a conductive layer with a gate insulating layer(not shown) being one of an oxide layers and a poly silicon, a tungsten or a tungsten silicide or the like independently or compositely in a thickness ranging from about 400 to about 2000 Å and a hard mask insulating layer with a nitride material, a gate electrode pattern of a structure stacked with a conductive layer 52 and a hard mask 53 are formed by implementing a photolithography process by using a mask to form the gate electrode pattern.

An etching stop layer 54 is then deposited thinly along the profile of the conductive pattern.

It is preferable that the etching stop layer 54 is made of a silicon oxidation nitride layer or a nitride layer such as a silicon nitride to prevent the loss of the conductive layer pattern during the following SAC etching and to obtain an etching profile by securing an etching selectivity for an insulating layer of an oxide layer.

Figure 5B:
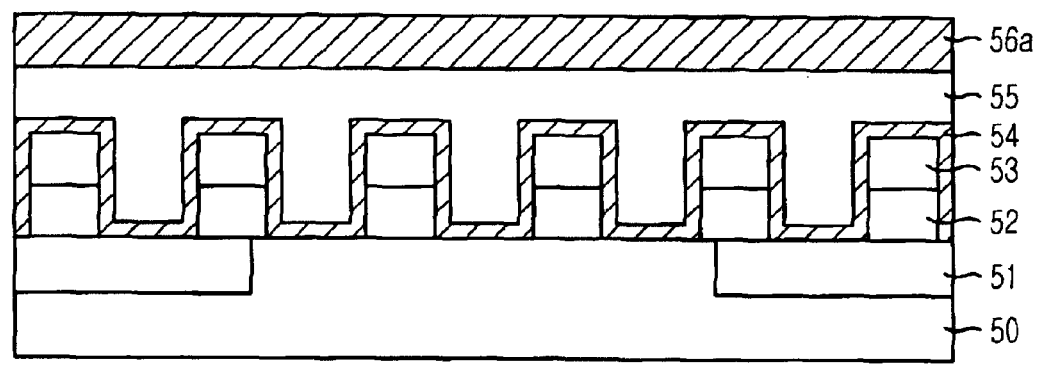
Figure 5C:
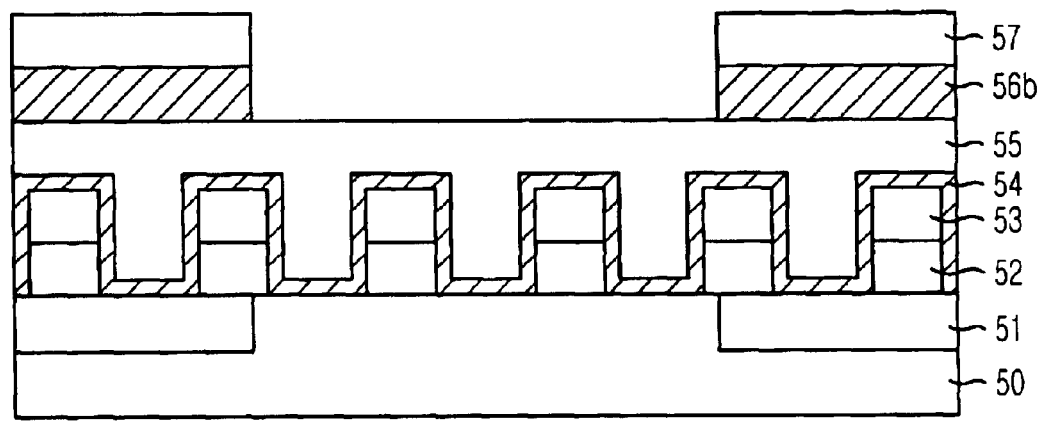

As shown in FIG. 5B, the insulating layer 55 is deposited enough to fill a space between the gate electrode patterns.

The insulating layer 55 as an oxide layer may be selected from a group consisting of a boro phospho silicate glass (BPSG) layer, a boro silicate glass(BSG) layer, a phospho silicate glass(PSG) layer, a high density plasma(HDP) oxidation layer, a tetra ethyl ortho silicate(TEOS) layer or an advanced planarization layer(APL) layer or the like.

In the following step, a hard mask material layer 56a is deposited on the top of the insulating layer 55 so as to overcome an etching characteristic of the photoresist pattern susceptible to the damage generated during the following SAC etching process.

Here, in case when the hard mask material layer 56a is made of an insulating material layer, it is preferable that a SiC layer, an undoped poly silicon layer, a silicon nitride layer or a silicon oxidation nitride layer is utilized, whereas in case when the hard mask material layer 56a is made of a conductive material layer, it is preferable that a tungsten layer, a tungsten silicide layer or a doped poly silicon layer.

Thereafter, after a photoresist pattern 57 is formed on the hard mask material layer 56a as a cell contact mask so as to form the contact pad, the hard mask 56a is formed by etching the hard mask material layer 56a by using the photoresist pattern 57 as a mask, thereby defining the contact forming area.

On the other hand, a process for forming a bottom anti reflective coating(BARC) on an interface between the photoresist pattern 57 and the hard mask material layer 56a is omitted for the simplicity of the drawings.

The process for forming the photoresist pattern 57 may be performed by applying a argon fluoride (ArF) photolithography process. It is possible that the distortion of the photoresist pattern 57 becomes to be minimum since the insulating layer 55 is indirectly etched by using the photoresist pattern 57 as an etching mask.

Although the photoresist layer pattern 57 may be in the form of T, it can be utilized various type of photoresist layer pattern such as a bar type.

And then, after the photoresist layer pattern 57 is removed by implementing a photoresist strip process, an opening portion 58 is form through a conventional SAC process to etch the hard mask 56b as an etching mask for exposing the etching stop layer 54.

Figure 5D:
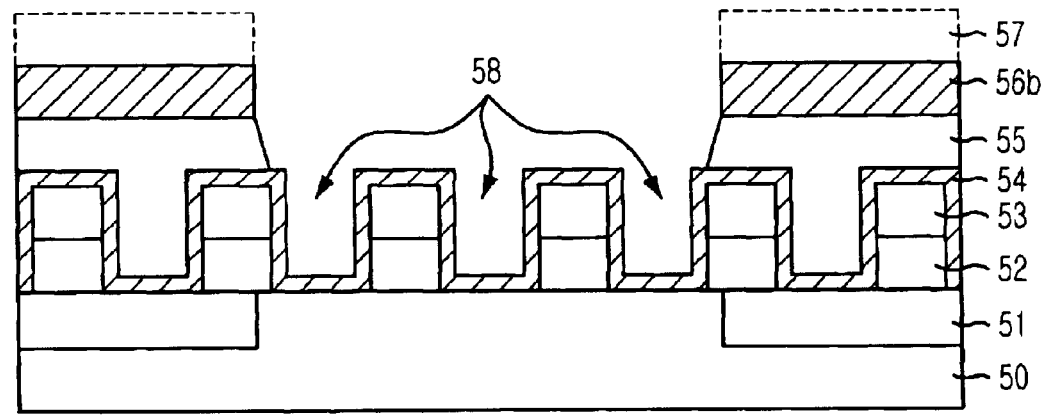

FIG. 5D is a cross sectional view of the process for forming the opening portion 58 through the SAC process.

The SAC etching process described above employs a recipe utilized during a conventional SAC etching process, that is, plasma including a CF gas is utilized.

Figure 5E:
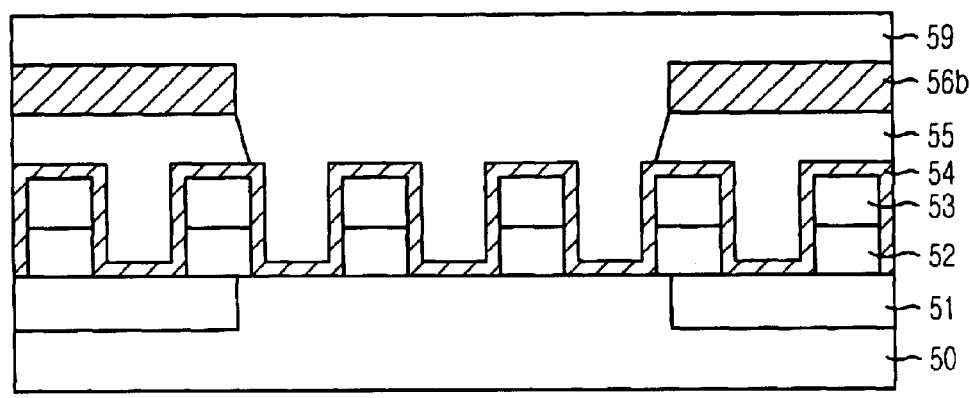

In the ensuing step, as shown in FIG. 5E, the opening portion 58 and the hard mask 56b are covered by depositing the polymer layer 59 enough to bury the opening portion 58.

The polymer layer 59 may be formed by using a low dielectric material SILK or a polymer such as an organic material of photoresist to prevent the silicon substrate 50 from being attacked during the etching back process to remove the hard mask 56b.

Thereafter, the hard mask 56b and the polymer layer 59 are removed by implementing an etching back process of a dry etching or an wet etching method, the opening area is expanded by removing the etching stop layer 54. Then, a pre-cleaning process is performed.

Figure 5F:
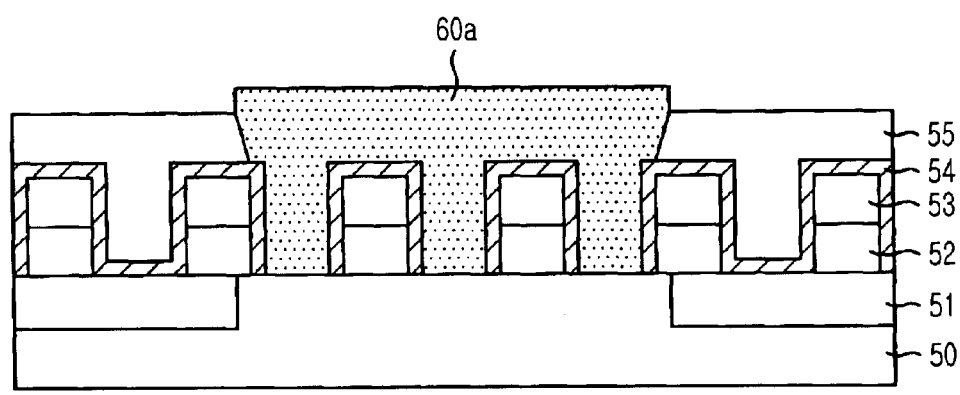

In the next step, as shown in FIG. 5F, a silicon epitaxial layer 60a is grown by applying the SEG method to the open portion 58 at which the opening area is enlarged.

More specifically, the silicon epitaxial layer 60a is grown from the exposed silicon substrate 50 by forming and controlling the partial pressure ratio ranging from about 0.4 to about 0.8 between the gases DCS($SiH_2Cl_2$)/HCl/$H_2$ and the gases $PH_3$/$H_2$ under a pressure ranging from about 10 Torr to about 200 Torr at the temperature ranging from about 800 to about 1000° C.

On the other hand, as stated above, it is possible that the method for depositing the poly silicon is employed in place of the method of SEG.

And then, a plurality of pads 60b isolated from neighboring pads 60b is formed by removing the silicon epitaxial layer 60a through a process of etching back or a chemical mechanical polishing(CMP).

Figure 5G:
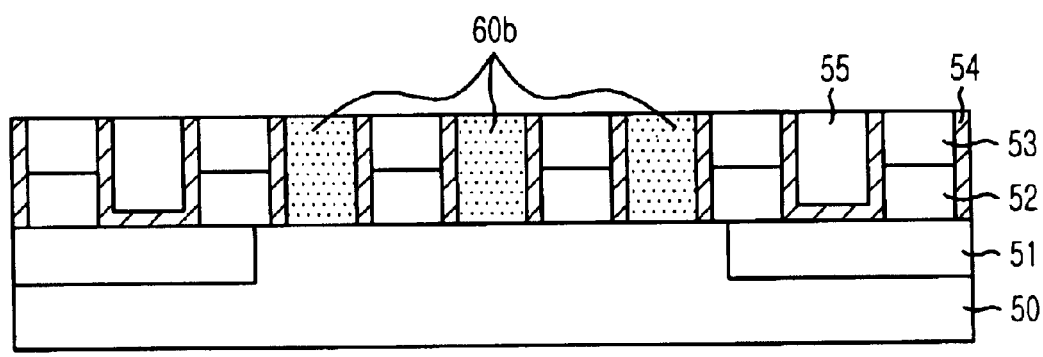

FIG. 5G is a cross sectional view illustrating a process for isolating the plurality of pads 60b from the gate hard mask 53 with planarizing the plurality of pads 60b.

As stated above, the disclosed methods are capable of preventing an undercut at the bottom portion by utilizing the hard mask during the SAC process and removing the hard mask before the formation of the pad formation conductive layer, thereby preventing the abnormal over growth of the SEG silicon during the formation of pad by the SEG method.

And also, the disclosed methods are expected to an excellent effect to improve the yield of the semiconductor device by suppressing the failure due to the abnormal over growth of the silicon during the formation of the silicon layer by using the selective epitaxial growth(SEG) method during the formation of the contact pad.

While the disclosed methods have been described with respect to the particular embodiments, it will be apparent to those skilled in the art that various changes and modifications may be made without departing from the spirit and scope of the disclosed methods as defined in the following claims.

What is claimed is:

1. A method for fabricating a contact pad of a semiconductor device, the method comprising:

forming a plurality of conductive layer patterns displaced on a silicon substrate with adjoining to each other;

forming an insulating layer on a top of the conductive layer patterns;

depositing a material layer serving as a hard mask on the insulating layer;

forming a photoresist pattern between the conductive layer patterns on the hard mask material layer to form a contact hole;

defining an area for forming a contact by forming by etching the hard mask material layer with utilizing the photoresist pattern as an etching mask;

removing the photoresist pattern;

exposing the silicon substrate by etching the insulating layer with utilizing the hard mask as an etching mask to thereby form an open portion;

forming a polymer layer on the open portion;

exposing the silicon substrate by removing the hard mask and the polymer layer by implementing an etch back process; and forming a contacted pad on the exposed silicon substrate.

2. The method of claim 1, wherein the conductive layer pattern includes any one of a gate electrode pattern, a bit line pattern or a metal wiring.

3. A semiconductor device made in accordance with the method of claim 2.

4. The method of claim 1, wherein, in the step of forming the photoresist pattern comprises using an argon fluoride (ArF) photoresist and an ArF light source.

5. A semiconductor device made in accordance with the method of claim 4.

6. The method of claim 1, wherein the hard mask material layer includes an insulating material layer selected from the group consisting of a SiC layer, an undoped poly silicon layer, a silicon nitride layer, and a silicon oxide nitride layer.

7. A semiconductor device made in accordance with the method of claim 6.

8. The method of claim 1, wherein the insulating material layer is formed at a thickness ranging of about 400 Å to about 2000 Å.

9. A semiconductor device made in accordance with the method of claim 8.

10. The method of claim 1, wherein the hard mask material layer includes a conductive material layer selected from the group consisting of a tungsten layer, a tungsten silicide layer or a doped poly silicon layer.

11. A semiconductor device made in accordance with the method of claim 10.

12. The method of claim 1, further comprising the step of forming a bottom arc layer with an organic material.

13. A semiconductor device made in accordance with the method of claim 12.

14. The method of claim 1, wherein the contact pad is a doped poly silicon layer.

15. A semiconductor device made in accordance with the method of claim 14.

16. A semiconductor device made in accordance with the method of claim 1.

* * * * *